United States Patent
Yamanaka et al.

(10) Patent No.: US 8,657,648 B2
(45) Date of Patent: Feb. 25, 2014

(54) PROCESSING APPARATUS HAVING FOUR PROCESSING UNITS

(75) Inventors: Satoshi Yamanaka, Ota-Ku (JP); Toshiyasu Rikiishi, Ota-ku (JP); Nobuyuki Takada, Ota-ku (JP)

(73) Assignee: Disco Corporation, Tokyo (JP)

( * ) Notice: Subject to any disclaimer, the term of this patent is extended or adjusted under 35 U.S.C. 154(b) by 302 days.

(21) Appl. No.: 13/271,731

(22) Filed: Oct. 12, 2011

(65) Prior Publication Data
US 2012/0088441 A1 Apr. 12, 2012

(30) Foreign Application Priority Data

Oct. 12, 2010 (JP) .................................. 2010-229901

(51) Int. Cl.
*B24B 1/00* (2006.01)
(52) U.S. Cl.
USPC ........ 451/11; 451/5; 451/57; 451/58; 451/65; 451/66; 451/331; 451/332; 451/333; 451/285
(58) Field of Classification Search
USPC ......... 451/8, 9, 10, 11, 41, 57, 58, 65, 66, 73, 451/331–333, 339, 285–289
See application file for complete search history.

(56) References Cited

U.S. PATENT DOCUMENTS

| | | | | |
|---|---|---|---|---|
| 5,174,067 A | * | 12/1992 | Hasegawa et al. | 451/291 |
| 6,165,056 A | * | 12/2000 | Hayashi et al. | 451/281 |
| RE37,622 E | * | 4/2002 | Karlsrud et al. | 451/11 |
| 6,368,193 B1 | * | 4/2002 | Carlson et al. | 451/66 |
| 6,626,744 B1 | * | 9/2003 | White et al. | 451/66 |
| 6,629,883 B2 | * | 10/2003 | Katsuoka et al. | 451/332 |
| 6,685,542 B2 | * | 2/2004 | Mori et al. | 451/65 |
| 6,846,224 B2 | * | 1/2005 | Ki | 451/9 |
| 6,966,823 B2 | * | 11/2005 | Bauer et al. | 451/41 |
| 7,022,000 B2 | * | 4/2006 | Mizomoto et al. | 451/65 |
| 7,413,496 B2 | * | 8/2008 | Yoshimura et al. | 451/5 |
| 2001/0029158 A1 | * | 10/2001 | Sasaki et al. | 451/66 |
| 2002/0081954 A1 | * | 6/2002 | Mori et al. | 451/65 |
| 2006/0068684 A1 | * | 3/2006 | Kubota | 451/5 |
| 2006/0194525 A1 | * | 8/2006 | Tolles et al. | 451/66 |
| 2007/0010167 A1 | * | 1/2007 | Cooper et al. | 451/5 |
| 2009/0270015 A1 | * | 10/2009 | D'Ambra et al. | 451/28 |

FOREIGN PATENT DOCUMENTS

| | | |
|---|---|---|
| JP | 2-15257 | 1/1990 |
| JP | 4-2776 | 1/1992 |

\* cited by examiner

*Primary Examiner* — George Nguyen
(74) *Attorney, Agent, or Firm* — Greer, Burns & Crain, Ltd.

(57) ABSTRACT

A processing apparatus includes a turn table rotatably provided and having an opening; at least five chuck tables provided on the turn table, each chuck table having a holding surface for holding a workpiece; a support bed inserted through the opening of the turn table; four processing unit supporting mechanisms each including a first support column provided on the outside of the turn table, a second support column provided on the support bed, and a support member mounted to the first and second support columns; four processing units respectively supported by the four processing unit supporting mechanisms, the four processing units respectively corresponding to four of the at least five chuck tables; and four feeding units for respectively moving the four processing units in a direction perpendicular to the holding surfaces of the chuck tables.

3 Claims, 4 Drawing Sheets

PROCESSING APPARATUS HAVING FOUR PROCESSING UNITS

BACKGROUND OF THE INVENTION

1. Field of the Invention

The present invention relates to a processing apparatus having a plurality of processing units for processing a workpiece such as a semiconductor wafer and an optical device wafer.

2. Description of the Related Art

In a semiconductor device fabrication process, a plurality of crossing division lines called streets are formed on the front side of a substantially disk-shaped semiconductor wafer to thereby partition a plurality of rectangular regions where a plurality of semiconductor circuits are respectively formed. The semiconductor wafer thus having the plural semiconductor circuits is cut along these streets to thereby divide the rectangular regions where the semiconductor circuits are formed from each other, thus obtaining a plurality of individual semiconductor chips. Also in an optical device wafer such that a plurality of crossing streets are formed on the front side of a sapphire substrate or the like to partition a plurality of regions where a plurality of optical devices are respectively formed from gallium nitride compound semiconductors or the like, the optical device wafer is divided along the streets to obtain the individual optical devices such as light emitting diodes and laser diodes, which are widely used in electric equipment.

Prior to cutting the wafer along the streets to obtain the individual chips, the back side of the wafer is ground to reduce the thickness of the wafer to a predetermined thickness, thereby reducing the size and weight of each chip. In general, the grinding of the back side of the wafer is performed by using a grinding apparatus including coarse grinding means and finish grinding means for grinding a workpiece held on a chuck table. However, a time period for coarse grinding by the coarse grinding means is different from that for finish grinding by the finish grinding means, so that it is difficult to synchronize the coarse grinding operation and the finish grinding operation. To solve this problem, there has been proposed a grinding apparatus including semifinish grinding means in addition to the coarse grinding means and the finish grinding means (see Japanese Utility Model Laid-open No. Hei 2-15257, for example).

Further, when the back side of the wafer is ground, a grinding strain such as microcrack is produced on the back side of the wafer, causing a considerable reduction in die strength of each chip obtained by dividing the wafer. To remove the grinding strain produced on the back side of the wafer ground, there has been proposed a processing apparatus including polishing means in addition to the coarse grinding means, the semifinish grinding means, and the finish grinding means (see Japanese Utility Model Laid-open No. Hei 4-2776, for example).

SUMMARY OF THE INVENTION

The processing apparatus disclosed in Japanese Utility Model Laid-open No. Hei 4-2776 mentioned above includes a turn table, a plurality of chuck tables provided on the turn table for holding a plurality of workpieces, and four processing means provided along the outer circumference of the turn table, the four processing means being provided by coarse grinding means, semifinish grinding means, finish grinding means, and polishing means. Accordingly, the processing apparatus becomes large in size as a whole and a large installation area is therefore necessary, causing an increase in equipment cost.

It is therefore an object of the present invention to provide a processing apparatus having four processing means which can be reduced in size.

In accordance with an aspect of the present invention, there is provided a processing apparatus including a turn table rotatably provided and having an opening; at least five chuck tables provided on the turn table at the vertices of a regular polygon, each of the chuck tables having a holding surface for holding a workpiece; a support bed inserted through the opening of the turn table; four processing means supporting mechanisms each including a first support column provided on the outside of the turn table, a second support column provided on the support bed, and a support member mounted to the first and second support columns, the four first support columns of the four processing means supporting mechanisms being arranged at the corners of a square; four processing means respectively supported to the four processing means supporting mechanisms, the four processing means respectively corresponding to four ones of the at least five chuck tables; four feeding means for respectively moving the four processing means in a direction perpendicular to the holding surfaces of the chuck tables; and a loading/unloading area for loading and unloading a workpiece to/from the remaining chuck table in the condition where the turn table is rotated to position the four chuck tables corresponding to the four processing means in four processing areas where the four processing means are respectively operated.

Preferably, the four processing means are arranged so as to be symmetrical with respect to a line connecting the loading/unloading area and the center of rotation of the turn table.

Preferably, the four processing means include three grinding means for grinding the workpiece and one polishing means for polishing the workpiece.

In the processing apparatus according to the present invention, each of the four processing means supporting mechanisms provided in the vicinity of the turn table on which the at least five chuck tables are provided is composed of the first support column provided on the outside of the turn table, the second support column provided on the support bed inserted through the opening of the turn table, and the support member mounted to the first and second support columns, wherein the four first support columns of the four processing means supporting mechanisms are arranged at the corners of a square. Accordingly, the four processing means supporting mechanisms can be installed in a minimum area. As a result, the processing apparatus can be reduced in size as a whole and a large installation area is therefore unnecessary, thereby suppressing an equipment cost.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
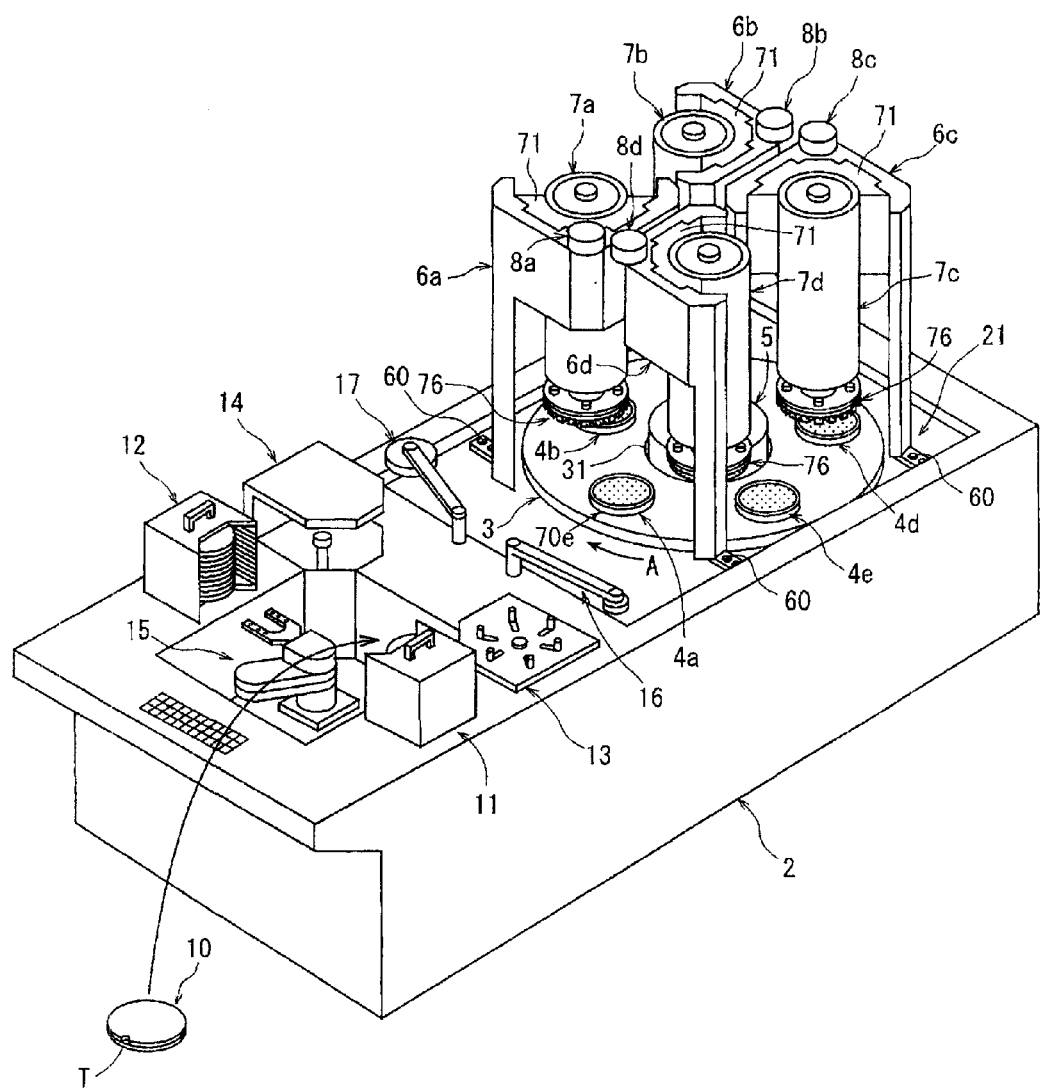
FIG. 1 is a perspective view of a processing apparatus according to a preferred embodiment of the present invention.

A preferred embodiment of the processing apparatus according to the present invention will now be described in detail with reference to the attached drawings. FIG. 1 is a perspective view of a processing apparatus according to a preferred embodiment of the present invention.

Figure 2:
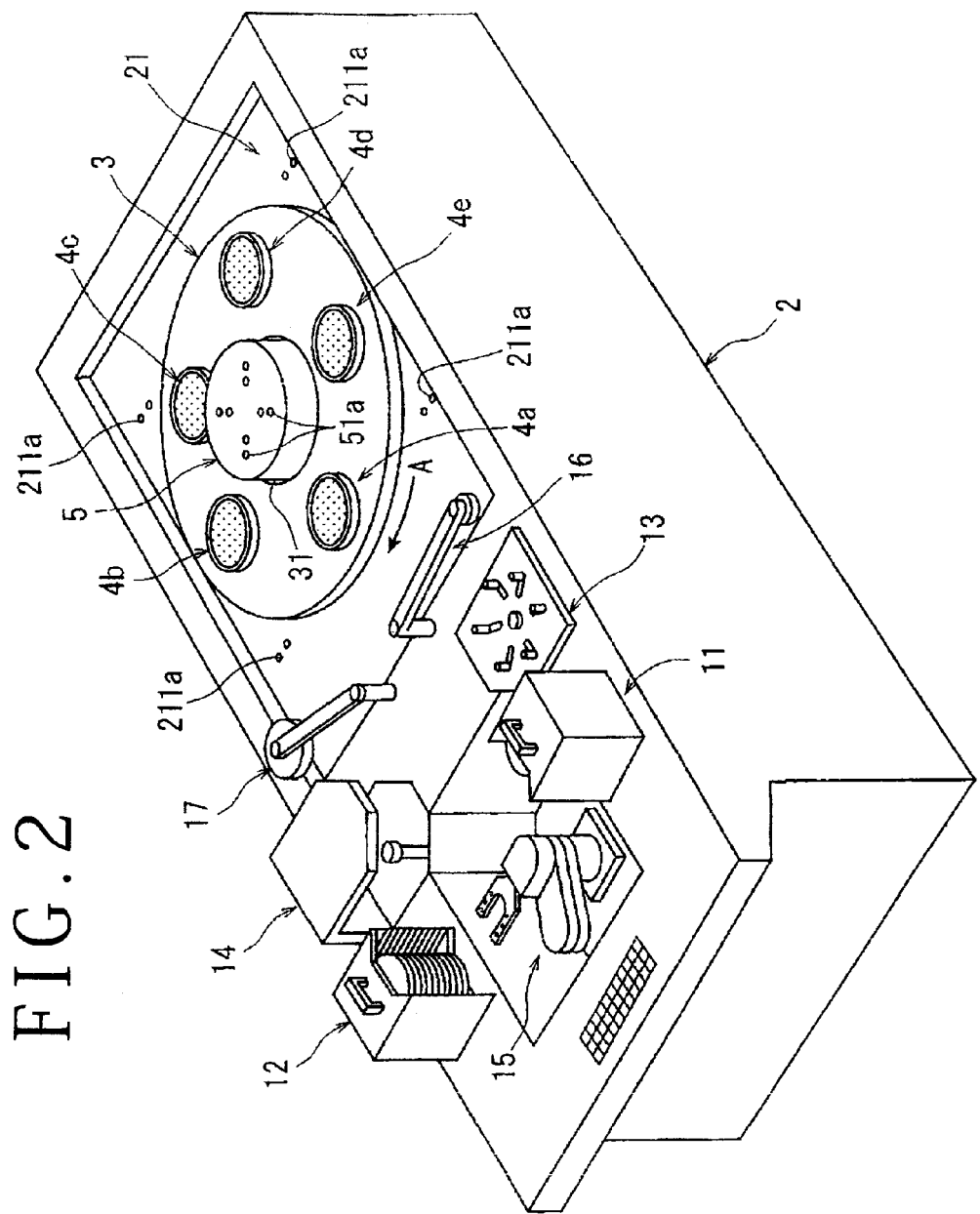
FIG. 2 is a perspective view similar to FIG. 1, showing a condition where four processing means supporting mechanisms and four processing means constituting the processing apparatus shown in FIG. 1 are removed.

The processing apparatus shown in FIG. 1 has a housing 2. The housing 2 has an elongated boxlike shape. A working area 21 is formed on the upper surface of the housing 2, and a turn table 3 is rotatably provided in the working area 21. As shown in FIG. 2, the turn table 3 has an annular shape such that a central opening 31 is formed. The turn table 3 is suitably rotated by turn table rotating means (not shown) in the direction shown by an arrow A. As shown in FIG. 2, the turn table 3 is provided with five chuck tables 4a, 4b, 4c, 4d, and 4e each having an upper surface as a holding surface for holding a workpiece. These five chuck tables 4a to 4e are located at the vertices of a regular pentagon around the central opening 31 of the turn table 3. A support bed 5 projects from the upper surface of the housing 2 so as to be inserted through the central opening 31 of the turn table 3.

Figure 3:
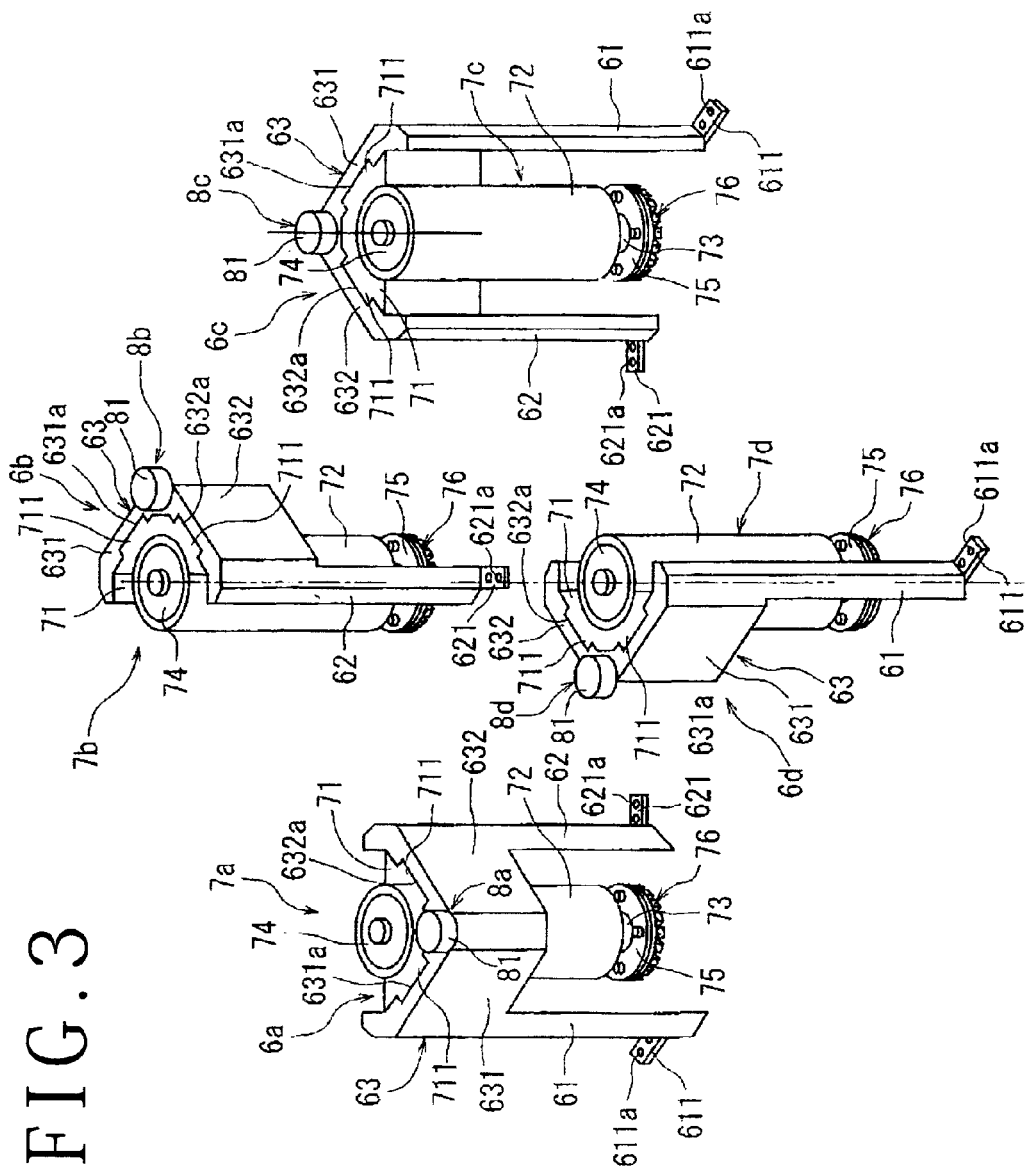
FIG. 3 is a perspective view of the four processing means supporting mechanisms and the four processing means.

As shown in FIGS. 1, 2, and 3, the processing apparatus according to this preferred embodiment includes four processing means supporting mechanisms 6a, 6b, 6c, and 6d for respectively supporting four processing means (to be described later) for processing the workpieces held on the five chuck tables 4a to 4e provided on the turn table 3. Each of the four processing means supporting mechanisms 6a to 6d is composed of a first support column 61 standing at a position outside of the turn table 3, a second support column 62 standing on the support bed 5, and a support member 63 mounted on the upper portions of the first and second support columns 61 and 62. The four first support columns 61 of the four processing means supporting mechanisms 6a to 6d are located at the corners of a square. The first support column 61 has a mounting portion 611 at the lower end. Similarly, the second support column 62 has a mounting portion 621 at the lower end. These mounting portions 611 and 621 are formed with insert holes 611a and 621a, respectively. The working area 21 and the support bed 5 of the housing 2 are formed with tapped holes 211a and 51a, respectively. A plurality of fastening bolts 60 are inserted through the insert holes 611a and 621a of the mounting portions 611 and 621 of the first and second support columns 61 and 62 are threadedly engaged with the tapped holes 211a and 51a of the working area 21 and the support bed 5 of the housing 2. Thus, the first support column 61 and the second support column 62 are mounted on the working area 21 and the support bed 5 of the housing 2. As described above, the four first support columns 61 of the four processing means supporting mechanisms 6a to 6d are located at the corners of a square on the outside of the turn table 3. Accordingly, the four processing means supporting mechanisms 6a to 6d can be installed in a minimum area.

The support member 63 of each of the four processing means supporting mechanisms 6a to 6d has two supporting portions 631 and 632 joined perpendicularly to each other. These two supporting portions 631 and 632 are respectively formed with guide grooves 631a and 632a extending in the vertical direction (in the direction perpendicular to the holding surfaces of the chuck tables 4a to 4e). Four processing means 7a, 7b, 7c, and 7d are respectively supported to the support members 63 of the four processing means supporting mechanisms 6a to 6d so as to be movable along the guide grooves 631a and 632a. In this preferred embodiment, the processing means 7a is provided by coarse grinding means, the processing means 7b is provided by semifinish grinding means, the processing means 7c is provided by finish grinding means, and the processing means 7d is provided by polishing means. Each of the coarse grinding means 7a, the semifinish grinding means 7b, the finish grinding means 7c, and the polishing means 7d includes a moving base 71, a spindle housing 72 mounted on the moving base 71, a rotating spindle 73 rotatably provided in the spindle housing 72, and a servo motor 74 for rotationally driving the rotating spindle 73. The lower end portion of the rotating spindle 73 projects downward from the lower end of the spindle housing 72, and a mounter 75 is provided on the lower end of the rotating spindle 73. A processing tool 76 is mounted on the lower surface of each mounter 75. The processing tool 76 of the coarse grinding means 7a is provided by a coarse grinding wheel having a plurality of abrasive members for coarse grinding. The processing tool 76 of the semifinish grinding means 7b is provided by a semifinish grinding wheel having a plurality of abrasive members for semifinish grinding. The processing tool 76 of the finish grinding means 7c is provided by a finish grinding wheel having a plurality of abrasive members for finish grinding. The processing tool 76 of the polishing means 7d is provided by a polishing wheel having a polishing pad.

The moving base 71 of each of the coarse grinding means 7a, the semifinish grinding means 7b, the finish grinding means 7c, and the polishing means 7d is formed with two guided rails 711 respectively slidably engaged with the guide grooves 631a and 632a of the supporting portions 631 and 632 of the support member 63 constituting each of the processing means supporting mechanisms 6a to 6d. Accordingly, by the slidable engagement of the guided rails 711 and the guide grooves 631a and 632a, each of the coarse grinding means 7a, the semifinish grinding means 7b, the finish grinding means 7c, and the polishing means 7d can be moved along the guide grooves 631a and 632a. Each of the coarse grinding means 7a, the semifinish grinding means 7b, the finish grinding means 7c, and the polishing means 7d is supported to the supporting portions 631 and 632 of the support member 63 in such a manner that the axis of rotation of the rotating spindle 73 intersects a line connecting the first support column 61 and the second support column 62.

The processing apparatus further includes four feeding means 8a, 8b, 8c, and 8d for respectively moving the coarse grinding means 7a, the semifinish grinding means 7b, the finish grinding means 7c, and the polishing means 7d in the direction perpendicular to the holding surfaces (upper surfaces) of the chuck tables 4a to 4e. Each of these four feeding means 8a to 8d is provided by a ball screw type moving mechanism (not shown) known in the art. Each of these four feeding means 8a to 8d includes a pulse motor 81 adapted to be operated normally and reversely. Accordingly, by the normal or reverse operation of the pulse motor 81, the moving base 71, i.e., each of the coarse grinding means 7a, the semifinish grinding means 7b, the finish grinding means 7c, and the polishing means 7d is moved downward along the guide grooves 631a and 632a (in the direction toward the holding surfaces of the chuck tables 4a to 4e) or upward along the guide grooves 631a and 632a (in the direction away from the holding surfaces of the chuck tables 4a to 4e).

Figure 4:
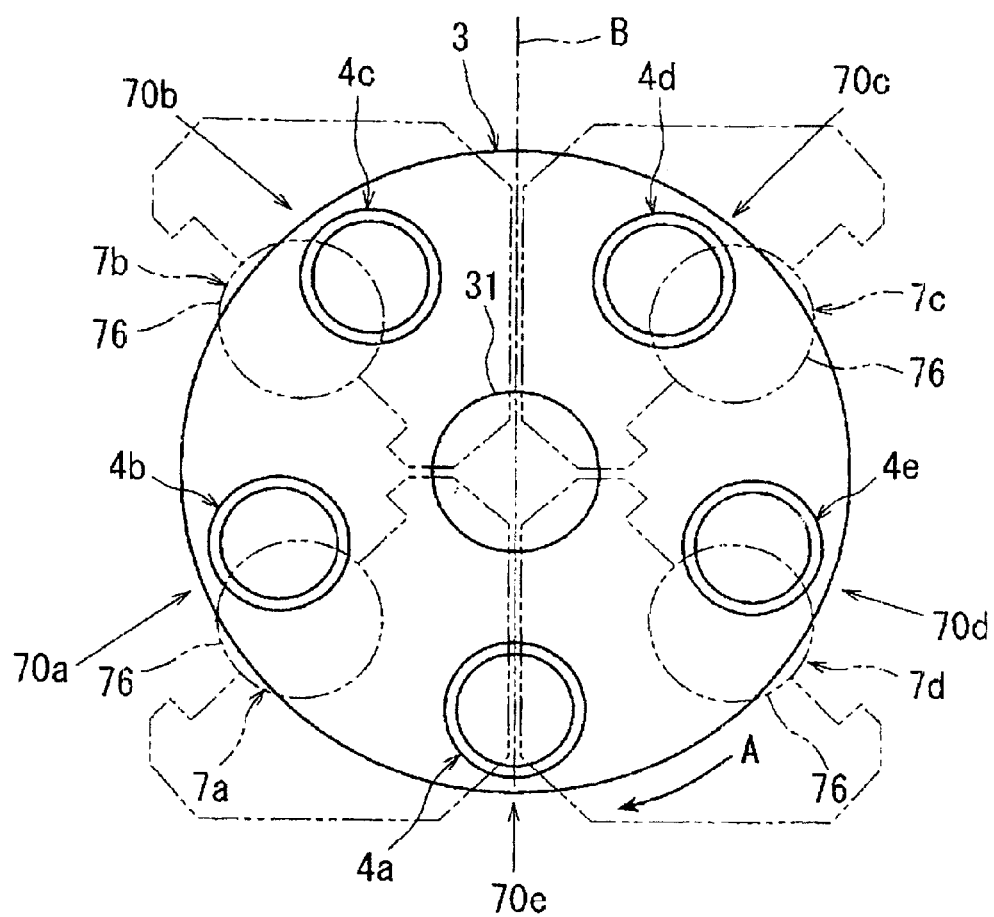
FIG. 4 is a schematic plan view for illustrating the relation between the four processing means and five chuck tables provided on a turn table constituting the processing apparatus shown in FIG. 1.

The relation between the processing tools 76 of the coarse grinding means 7a, the semifinish grinding means 7b, the finish grinding means 7c, and the polishing means 7d and the five chuck tables 4a to 4e will now be described with reference to FIG. 4. In the condition where the five chuck tables 4a to 4e provided on the turn table 3 are positioned as shown in FIG. 4, the chuck table 4b is positioned in a processing area 70a where the processing tool 76 of the coarse grinding means 7a is set, the chuck table 4c is positioned in a processing area 70b where the processing tool 76 of the semifinish grinding means 7b is set, the chuck table 4d is positioned in a processing area 70c where the processing tool 76 of the finish grinding means 7c is set, and the chuck table 4e is positioned in a processing area 70d where the processing tool 76 of the polishing means 7d is set. The remaining chuck table 4a is positioned in a loading/unloading area 70e where a workpiece is loaded or unloaded. These five chuck tables 4a to 4e are positioned in such a manner that the center of the chuck table 4b lies on the outer circumference of the processing tool 76 of the coarse grinding means 7a, the center of the chuck table 4c lies on the outer circumference of the processing tool 76 of the semifinish grinding means 7b, the center of the chuck table 4d lies on the outer circumference of the processing tool 76 of the finish grinding means 7c, and the center of the chuck table 4e lies on the outer circumference of the processing tool 76 of the polishing means 7d.

In the processing apparatus according to this preferred embodiment, each of the four processing means supporting mechanisms 6a to 6d provided in the vicinity of the turn table 3 on which the five chuck tables 4a to 4e are provided is composed of the first support column 61 standing at a position on the outside of the turn table 3, the second support column 62 standing on the support bed 5 located at the center of the turn table 3, and the support member 63 connecting the upper portions of the first and second support columns 61 and 62, wherein the four first support columns 61 of the four processing means supporting mechanisms 6a to 6d are located at the corners of a square. Accordingly, the four processing means supporting mechanisms 6a to 6d can be installed in a minimum area. As a result, the processing apparatus can be reduced in size as a whole and a large installation area is therefore unnecessary, thereby suppressing an equipment cost.

Further, as shown in FIG. 4, the coarse grinding means 7a, the semifinish grinding means 7b, the finish grinding means 7c, and the polishing means 7d as the four processing means supported by the four processing means supporting mechanisms 6a to 6d provided in the vicinity of the turn table 3 are arranged so as to be symmetrical with respect to a line B connecting the loading/unloading area 70e and the center of rotation of the turn table 3. Accordingly, good balance in rigidity can be ensured to thereby improve a processing accuracy. Further, common parts can be used for the right and left portions with respect to the line B and the number of parts can be reduced.

Referring back to FIG. 1, there are further provided on the front side (the left lower portion as viewed in FIG. 1) of the working area 21 of the housing 2 a first cassette 11, a second cassette 12, centering means 13, spinner cleaning means 14, workpiece transporting means 15, workpiece loading means 16, and workpiece unloading means 17. The first cassette 11 functions to store a plurality of wafers 10 such as sapphire wafers, SiC wafers, and semiconductor wafers as workpieces to be processed. The first cassette 11 storing the wafers 10 is placed in a predetermined cassette loading area formed on the housing 2. Each wafer 10 is stored in the first cassette 11 in the condition where a protective tape T is attached to the front side of the wafer 10 and the back side of the wafer 10 is oriented upward. The second cassette 12 functions to store the wafers 10 processed by the processing means 7a to 7d. The second cassette 12 is placed in a predetermined cassette unloading area formed on the housing 2. The centering means 13 functions to center the wafer 10 to be processed. The centering means 13 is provided between the first cassette 11 and the workpiece loading/unloading area 70e. The spinner cleaning means 14 functions to clean the wafer 10 processed. The spinner cleaning means 14 is provided between the workpiece loading/unloading area 70e and the second cassette 12. The workpiece transporting means 15 functions to transport the wafer 10 to be processed from the first cassette 11 to the centering means 13 and also to transport the wafer 10 processed from the spinner cleaning means 14 to the second cassette 12. The workpiece transporting means 15 is provided between the first cassette 11 and the second cassette 12.

The workpiece loading means 16 functions to load the wafer 10 to be processed from the centering means 13 to the chuck table 4 (4a, 4b, 4c, 4d, or 4e) positioned in the workpiece loading/unloading area 70e. The workpiece loading means 16 is provided between the centering means 13 and the workpiece loading/unloading area 70e. The workpiece unloading means 17 functions to unload the wafer 10 processed from the chuck table 4 (4a, 4b, 4c, 4d, or 4e) positioned in the workpiece loading/unloading area 70e to the spinner cleaning means 14. The workpiece unloading means 17 is provided between the workpiece loading/unloading area 70e and the spinner cleaning means 14.

The first cassette 11 storing a predetermined number of wafers 10 to be processed is placed in the cassette loading area formed on the housing 2. After all of the wafers 10 stored in the first cassette 11 are loaded, the first cassette 11 now empty is manually replaced by a new cassette 11 storing a predetermined number of wafers 10 to be processed. Similarly, after a predetermined number of wafers 10 processed are stored into the second cassette 12 placed in the cassette unloading area formed on the housing 2, the second cassette 12 is manually replaced by a new empty cassette 12.

The operation of the processing apparatus according to this preferred embodiment will now be described mainly with reference to FIG. 1. One of the wafers 10 stored in the first cassette 11 is taken out by the vertical motion and horizontal motion of the workpiece transporting means 15 and transported to the centering means 13. The wafer 10 placed in the centering means 13 is centered by the radially inward motion of six positioning pins. After the wafer 10 is centered by the centering means 13, the wafer 10 is held under suction by the workpiece loading means 16 and loaded to the chuck table 4a positioned in the workpiece loading/unloading area 70e. The wafer 10 loaded to the chuck table 4a is held on the chuck table 4a under suction by operating suction means (not shown). Thereafter, the turn table 3 is rotated by a predetermined amount by the turn table rotating means (not shown) in the direction of the arrow A, thereby shifting the chuck table 4a holding the wafer 10 to the processing area 70a where the processing tool 76 of the coarse grinding means 7a is set. By the above-mentioned rotation of the turn table 3, the chuck table 4b is shifted to the processing area 70b where the processing tool 76 of the semifinish grinding means 7b is set, the chuck table 4c is shifted to the processing area 70c where the processing tool 76 of the finish grinding means 7c is set, the chuck table 4d is shifted to the processing area 70d where the processing tool 76 of the polishing means 7d is set, and the chuck table 4e is shifted to the loading/unloading area 70e where the workpiece is loaded or unloaded.

In the processing area 70a where the processing tool 76 of the coarse grinding means 7a is set, the back side (upper surface) of the first wafer 10 held on the chuck table 4a is subjected to coarse grinding by the coarse grinding means 7a. At this time, the second wafer 10 to be processed is loaded to the chuck table 4e shifted to the loading/unloading area 70e. This second wafer 10 loaded to the chuck table 4e is held on the chuck table 4e under suction by operating the suction means (not shown).

Thereafter, the turn table 3 is rotated by a predetermined amount by the turn table rotating means (not shown) in the direction of the arrow A. As a result, the chuck table 4e holding the second wafer 10 to be processed in the loading/unloading area 70e is shifted to the processing area 70a where the processing tool 76 of the coarse grinding means 7a is set, the chuck table 4a holding the first wafer 10 subjected to coarse grinding is shifted to the processing area 70b where the processing tool 76 of the semifinish grinding means 7b is set, the chuck table 4b is shifted to the processing area 70c where the processing tool 76 of the finish grinding means 7c is set, the chuck table 4c is shifted to the processing area 70d where the processing tool 76 of the polishing means 7d is set, and the chuck table 4d is shifted to the loading/unloading area 70e.

In the processing area 70a where the processing tool 76 of the coarse grinding means 7a is set, the back side (upper surface) of the second wafer 10 held on the chuck table 4e is subjected to coarse grinding by the coarse grinding means 7a. In the processing area 70b where the processing tool 76 of the semifinish grinding means 7b is set, the back side (upper surface) of the first wafer 10 held on the chuck table 4a is subjected to semifinish grinding by the semifinish grinding means 7b. At this time, the third wafer 10 to be processed is loaded to the chuck table 4d shifted to the loading/unloading area 70e. This third wafer 10 loaded to the chuck table 4d is held on the chuck table 4d under suction by operating the suction means (not shown).

Thereafter, the turn table 3 is rotated by a predetermined amount by the turn table rotating means (not shown) in the direction of the arrow A. As a result, the chuck table 4d holding the third wafer 10 to be processed in the loading/unloading area 70e is shifted to the processing area 70a where the processing tool 76 of the coarse grinding means 7a is set, the chuck table 4e holding the second wafer 10 subjected to coarse grinding is shifted to the processing area 70b where the processing tool 76 of the semifinish grinding means 7b is set, the chuck table 4a holding the first wafer 10 subjected to semifinish grinding is shifted to the processing area 70c where the processing tool 76 of the finish grinding means 7c is set, the chuck table 4b is shifted to the processing area 70d where the processing tool 76 of the polishing means 7d is set, and the chuck table 4c is shifted to the loading/unloading area 70e.

In the processing area 70a where the processing tool 76 of the coarse grinding means 7a is set, the back side (upper surface) of the third wafer 10 held on the chuck table 4d is subjected to coarse grinding by the coarse grinding means 7a. In the processing area 70b where the processing tool 76 of the semifinish grinding means 7b is set, the back side (upper surface) of the second wafer 10 held on the chuck table 4e is subjected to semifinish grinding by the semifinish grinding means 7b. In the processing area 70c where the processing tool 76 of the finish grinding means 7c is set, the back side (upper surface) of the first wafer 10 held on the chuck table 4a is subjected to finish grinding by the finish grinding means 7c. At this time, the fourth wafer 10 to be processed is loaded to the chuck table 4c shifted to the loading/unloading area 70e. This fourth wafer 10 loaded to the chuck table 4c is held on the chuck table 4c under suction by operating the suction means (not shown).

Thereafter, the turn table 3 is rotated by a predetermined amount by the turn table rotating means (not shown) in the direction of the arrow A. As a result, the chuck table 4c holding the fourth wafer 10 to be processed in the loading/unloading area 70e is shifted to the processing area 70a where the processing tool 76 of the coarse grinding means 7a is set, the chuck table 4d holding the third wafer 10 subjected to coarse grinding is shifted to the processing area 70b where the processing tool 76 of the semifinish grinding means 7b is set, the chuck table 4e holding the second wafer 10 subjected to semifinish grinding is shifted to the processing area 70c where the processing tool 76 of the finish grinding means 7c is set, the chuck table 4a holding the first wafer 10 subjected to finish grinding is shifted to the processing area 70d where the processing tool 76 of the polishing means 7d is set, and the chuck table 4b is shifted to the loading/unloading area 70e.

In the processing area 70a where the processing tool 76 of the coarse grinding means 7a is set, the back side (upper surface) of the fourth wafer 10 held on the chuck table 4c is subjected to coarse grinding by the coarse grinding means 7a. In the processing area 70b where the processing tool 76 of the semifinish grinding means 7b is set, the back side (upper surface) of the third wafer 10 held on the chuck table 4d is subjected to semifinish grinding by the semifinish grinding means 7b. In the processing area 70c where the processing tool 76 of the finish grinding means 7c is set, the back side (upper surface) of the second wafer 10 held on the chuck table 4e is subjected to finish grinding by the finish grinding means 7c. In the processing area 70d where the processing tool 76 of the polishing means 7d is set, the back side (upper surface) of the first wafer 10 held on the chuck table 4a is subjected to polishing by the polishing means 7d, thereby removing a grinding strain produced by the grinding. At this time, the fifth wafer 10 to be processed is loaded to the chuck table 4b shifted to the loading/unloading area 70e. This fifth wafer 10 loaded to the chuck table 4b is held on the chuck table 4b under suction by operating the suction means (not shown).

Thereafter, the turn table 3 is rotated by a predetermined amount by the turn table rotating means (not shown) in the direction of the arrow A. As a result, the chuck table 4b holding the fifth wafer 10 to be processed in the loading/unloading area 70e is shifted to the processing area 70a where the processing tool 76 of the coarse grinding means 7a is set, the chuck table 4c holding the fourth wafer 10 subjected to coarse grinding is shifted to the processing area 70b where the processing tool 76 of the semifinish grinding means 7b is set, the chuck table 4d holding the third wafer 10 subjected to semifinish grinding is shifted to the processing area 70c where the processing tool 76 of the finish grinding means 7c is set, the chuck table 4e holding the second wafer 10 subjected to finish grinding is shifted to the processing area 70d where the processing tool 76 of the polishing means 7d is set, and the chuck table 4a holding the first wafer 10 subjected to polishing is shifted to the loading/unloading area 70e.

As described above, the chuck table 4a is sequentially positioned to the processing area 70a where the processing tool 76 of the coarse grinding means 7a is set, the processing area 70b where the processing tool 76 of the semifinish grinding means 7b is set, the processing area 70c where the processing tool 76 of the finish grinding means 7c is set, and the processing area 70d where the processing tool 76 of the polishing means 7d is set. Thereafter, the chuck table 4a is returned to the loading/unloading area 70e, and the suction holding of the first wafer 10 on the chuck table 4a is canceled.

Thereafter, the workpiece unloading means 17 is operated to unload the first wafer 10 from the chuck table 4a positioned in the loading/unloading area 70e to the spinner cleaning means 14. The first wafer 10 is cleaned by the spinner cleaning means 14 and next transported to the second cassette 12 by the workpiece transporting means 15. The first wafer 10 is stored at a predetermined position in the second cassette 12 by the workpiece transporting means 15.

Having thus described the specific preferred embodiment of the present invention, it should be noted that the present invention is not limited to the above preferred embodiment, but various modifications may be made within the scope of the present invention. For example, while the four processing means are provided by three grinding means and one polishing means in this preferred embodiment, the four processing means may be provided by four grinding means. In this case, a workpiece formed of a hard material such as sapphire can be efficiently ground to a predetermined thickness. Further, while the five chuck tables provided on the turn table are arranged at the vertices of a regular pentagon in this preferred embodiment, six or more chuck tables may be arranged at the vertices of a regular polygon such as a regular hexagon and a regular heptagon as required.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus comprising:
a turn table rotatably provided and having an opening;
at least five chuck tables provided on said turn table at the vertices of a regular polygon, each of said chuck tables having a holding surface for holding a workpiece;
a support bed inserted through said opening of said turn table;
four processing means supporting mechanisms each including a first support column provided on the outside of said turn table, a second support column provided on said support bed, and a support member mounted to said first and second support columns, said four first support columns of said four processing means supporting mechanisms being arranged at the corners of a square;
four processing means respectively supported by said four processing means supporting mechanisms, said four processing means respectively corresponding to four of said at least five chuck tables;
four feeding means for respectively moving said four processing means in a direction perpendicular to said holding surfaces of said chuck tables; and
a loading/unloading area for loading and unloading a workpiece to/from a remaining chuck table in a condition where said turn table is rotated to position said four chuck tables corresponding to said four processing means in four processing areas where said four processing means are respectively operated.

2. The processing apparatus according to claim 1, wherein said four processing means are arranged so as to be symmetrical with respect to a line connecting said loading/unloading area and the center of rotation of said turn table.

3. The processing apparatus according to claim 1, wherein said four processing means include three grinding means for grinding said workpiece and one polishing means for polishing said workpiece.

* * * * *